(12) United States Patent
Fleck et al.

(10) Patent No.: US 7,759,182 B2
(45) Date of Patent: Jul. 20, 2010

(54) DUMMY ACTIVE AREA IMPLEMENTATION

(75) Inventors: Robert G. Fleck, Allen, TX (US); Leif C. Olsen, Plano, TX (US); Howard L. Tigelaar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 598 days.

(21) Appl. No.: 11/594,601

(22) Filed: Nov. 8, 2006

(65) Prior Publication Data

US 2008/0122009 A1 May 29, 2008

(51) Int. Cl.
*H01L 21/338* (2006.01)

(52) U.S. Cl. ............... 438/183; 438/129; 257/E21.453; 257/326

(58) Field of Classification Search .................. 438/129, 438/130, 183, 219, 405, 926; 257/326, 620, 257/E21.453
See application file for complete search history.

(56) References Cited

U.S. PATENT DOCUMENTS

| | | | |
|---|---|---|---|
| 6,214,699 B1 | 4/2001 | Joyner | |
| 6,492,703 B1 | 12/2002 | Pan | |
| 6,555,476 B1 | 4/2003 | Olsen et al. | |
| 6,677,240 B1 | 1/2004 | Tigelaar | |
| 7,034,367 B2 | 4/2006 | Kobori | |
| 2002/0061608 A1* | 5/2002 | Kuroda et al. | 438/129 |
| 2005/0112840 A1 | 5/2005 | Doong et al. | |
| 2005/0139905 A1 | 6/2005 | Jung | |
| 2006/0228850 A1* | 10/2006 | Tsai et al. | 438/219 |

* cited by examiner

*Primary Examiner*—Ha Tran T Nguyen
*Assistant Examiner*—Daniel Whalen
(74) *Attorney, Agent, or Firm*—Warren L. Franz; Wade J. Brady, III; Frederick J. Telecky, Jr.

(57) ABSTRACT

Areas of a semiconductor substrate where semiconductor devices are not to be formed are filled in with dummy active areas. Whole dummy active areas are formed in areas of the semiconductor substrate where semiconductor devices are not to be formed, and partial dummy active areas are formed in areas of the semiconductor substrate where semiconductor devices are not to be formed, but where whole dummy active areas can not be accommodated. The dummy active areas are staggered so as to provide uniform parasitic capacitive coupling to overlying leads regardless of the placement of the leads. The dummy active areas are substantially evenly separated from one another by dividers. The dummy active areas and dividers are formed concurrently with formation of semiconductor devices in non-dummy active areas. The dummy active areas mitigate yield loss by, among other things, providing more uniformity across the substrate, at least with regard to parasitic capacitances and stress and subsequent processing.

16 Claims, 8 Drawing Sheets

DUMMY ACTIVE AREA IMPLEMENTATION

FIELD OF THE INVENTION

The present invention relates generally to semiconductor processing, and more particularly to forming dummy active areas in areas of a semiconductor substrate where semiconductor devices are not to be formed.

BACKGROUND OF THE INVENTION

Several trends presently exist in the semiconductor and electronics industry. Devices are continually being made smaller, faster and requiring less power. One reason for these trends is that more personal devices are being fabricated that are relatively small and portable, thereby relying on a battery as their primary supply. For example, cellular phones, personal computing devices, and personal sound systems are devices that are in great demand in the consumer market. In addition to being smaller and more portable, personal devices are also requiring increased memory and more computational power and speed. In light of all these trends, there is an ever increasing demand in the industry for smaller and faster transistors used to provide the core functionality of the integrated circuits used in these devices.

Accordingly, in the semiconductor industry there is a continuing trend toward manufacturing integrated circuits (ICs) with higher densities. To achieve high densities, there has been and continues to be efforts toward scaling down dimensions (e.g., at submicron levels) on semiconductor wafers, that are generally produced from bulk silicon. In order to accomplish such high densities, smaller feature sizes, smaller separations between features, and more precise feature shapes are required in integrated circuits (ICs) fabricated on small rectangular portions of the wafer, commonly known as die. This may include the width and spacing of interconnecting lines, spacing and diameter of contact holes, as well as the surface geometry of various other features (e.g., corners and edges).

It can be appreciated that significant resources go into scaling down device dimensions and increasing packing densities. For example, significant man hours may be required to design such scaled down devices, equipment necessary to produce such devices may be expensive and/or processes related to producing such devices may have to be very tightly controlled and/or be operated under very specific conditions, etc. Accordingly, it can be appreciated that there can be significant costs associated with exercising quality control over semiconductor fabrication, including, among other things, costs associated with discarding defective units, and thus wasting raw materials and/or man hours, as well as other resources, for example. Additionally, since the units are more tightly packed on the wafer, more units are lost when some or all of a wafer is defective and thus has to be discarded. Accordingly, techniques that mitigate yield loss (e.g., a reduction in the number of acceptable or usable units), among other things, would be desirable.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

Areas of a semiconductor substrate where semiconductor devices are not to be formed are filled in with dummy active areas. Whole dummy active areas are formed in areas of the semiconductor substrate where semiconductor devices are not to be formed, and partial dummy active areas are formed in areas of the semiconductor substrate where semiconductor devices are not to be formed, but where whole dummy active areas can not be accommodated. The dummy active areas are substantially evenly separated from one another by dividers. The dummy active areas and dividers are formed concurrently with formation of semiconductor devices in non-dummy active areas. The dummy active areas mitigate yield loss by providing more uniformity across the substrate, at least with regard to parasitic capacitances and subsequent processing.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 12-15 are top views of example semiconductor substrates where areas of the substrates where semiconductor devices are not to be formed are filled in with dummy active areas as described herein, where FIG. 11 is a cross-sectional view of FIG. 12 taken along line 11-11.

DETAILED DESCRIPTION OF THE INVENTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding. It may-be evident, however, to one skilled in the art, that one or more aspects described herein may be practiced with a lesser degree of these specific details. In other instances, known structures and devices are shown in block diagram form to facilitate a thorough understanding.

Figure 1:
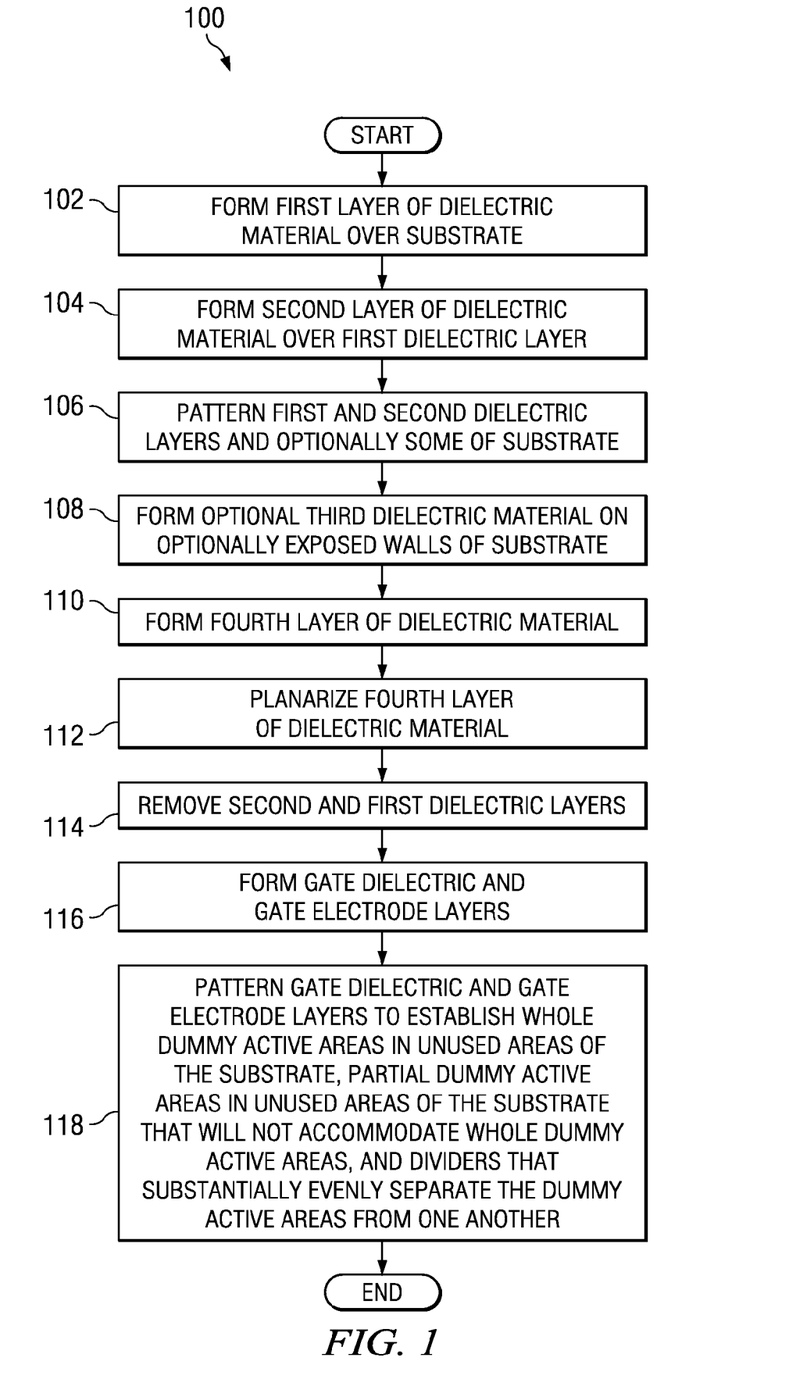
FIG. 1 is a flow diagram illustrating an example methodology for filling in areas of a semiconductor substrate where semiconductor devices are not to be formed as described herein.

An example methodology 100 for filling in areas of a semiconductor substrate where semiconductor devices are not to be formed as described herein is illustrated in FIG. 1, and an example semiconductor substrate where areas of the substrate 200 that are not to include semiconductor devices are filled in with dummy active areas as described herein is illustrated in cross-sectional view in FIGS. 2-9. While the method 100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 2:
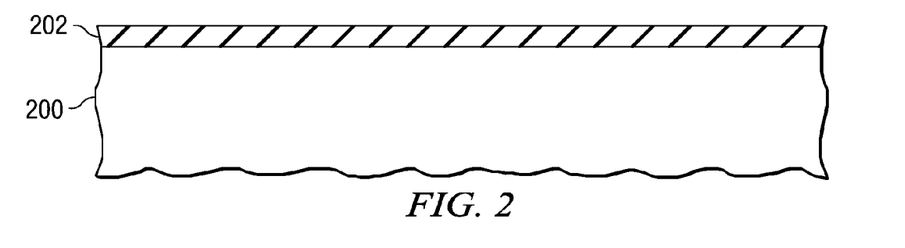
FIGS. 2-11 are cross-sectional views of an example semiconductor substrate where areas of the substrate where semiconductor devices are not to be formed are filled in with dummy active areas as described herein.
Figure 3:
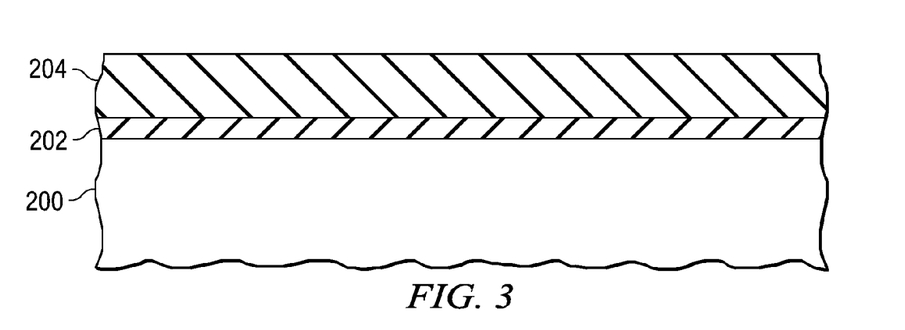

At the outset, a first layer of dielectric material 202 (e.g., an oxide based material) is formed over the substrate 200 at 102 (FIG. 2). The first layer of dielectric material may be formed to a thickness of between about 5 nm and about 20 nm, for example. A second layer of dielectric material 204 (e.g., a nitride based material) is then formed over the first layer of dielectric material 202 at 104 (FIG. 3). The second layer of dielectric material may be formed to a thickness of between about 50nm and about 150nm, for example.

Figure 4:
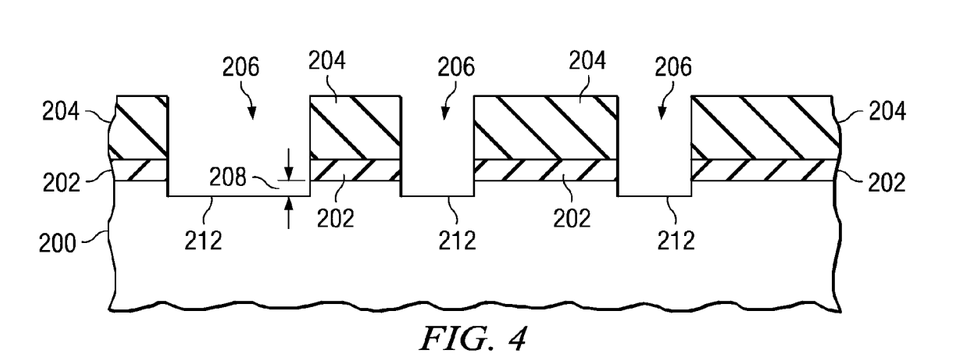
Figure 5:
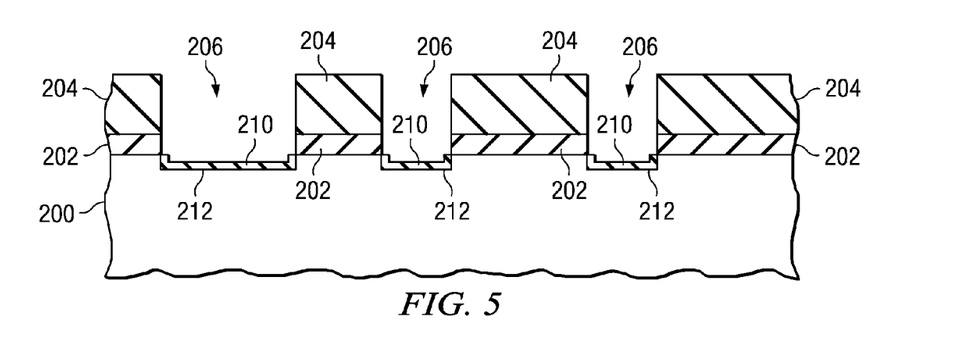

The second 204 and first 202 layers of dielectric material are then selectively patterned at 106 (FIG. 4). It will be appreciated that the second 204 and first 202 layers of dielectric material are patterned in a manner that facilitates establishing whole and partial dummy active areas in areas of the substrate 200 where semiconductor devices are not to be formed. More particularly, the second 204 and first 202 layers of dielectric material are patterned so that areas of the substrate 200 where semiconductor devices are not to be formed are filled in with whole dummy active areas, while areas of the substrate 200 where semiconductor devices are not to be formed but that cannot accommodate whole dummy active areas are filled in with partial dummy active areas. It will also be appreciated that this patterning is performed concurrently with patterning in areas of the semiconductor substrate where semiconductor devices are to be formed, i.e., in forming semiconductor devices (not shown) in non-dummy active areas. The processing at 106 is allowed to continue so that a little of the substrate 200 is patterned or removed as well, thereby forming one or more trenches in the substrate. For example, respective apertures 206 having a depth 208 of about ½ of a micron, for example, may be formed into the substrate at 106. An optional third dielectric material 210 (e.g., an oxide based material) can be formed (e.g., grown) on the exposed surfaces 212 of the substrate 200 at 108 (FIG. 5). The optional third dielectric material 210 may extend between about 1 nm and about 10 nm off of the exposed surfaces 212, for example.

Figure 6:
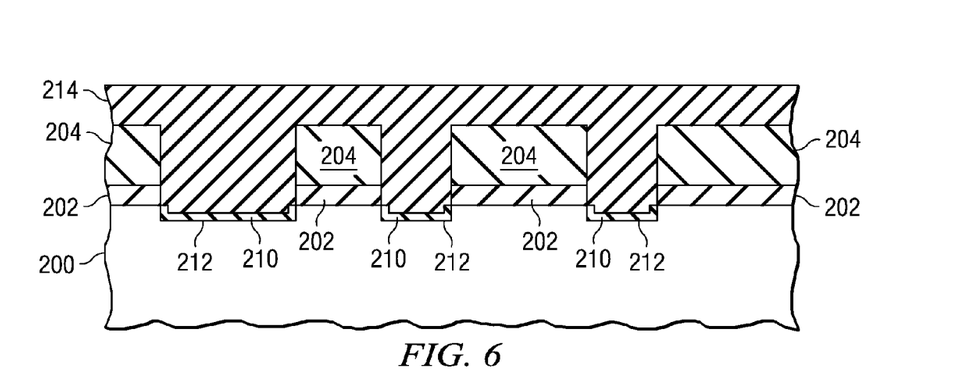
Figure 7:
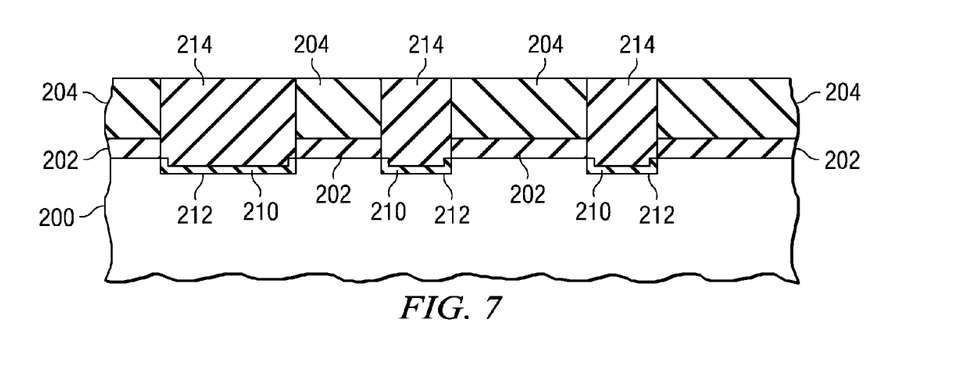

A fourth dielectric material 214 (e.g., an oxide based material) is then formed (e.g., deposited) over the optional third dielectric material 210 and up over the second dielectric layer 204 at 110 (FIG. 6). The fourth layer of dielectric material 214 may be formed to a cumulative thickness sufficient to slightly overfill the apertures, for example. Further, the fourth dielectric material 214 may be referred to as shallow trench isolation (STI) material that is implemented to electrically isolate active areas from one another. The fourth layer of dielectric material 214 is then planarized (e.g., via chemical mechanical polishing (CMP)) at 112 to reveal the second layer of dielectric material 204 while leaving the fourth dielectric material 214 over the (formerly) exposed portions 212 of the substrate 200 (FIG. 7).

Figure 8:
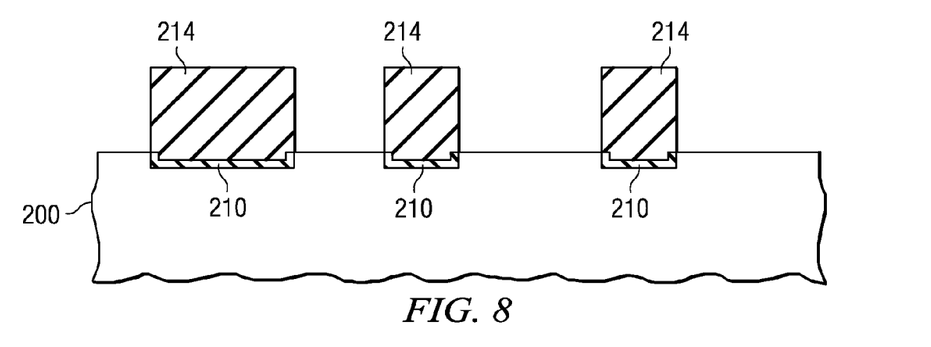
Figure 9:
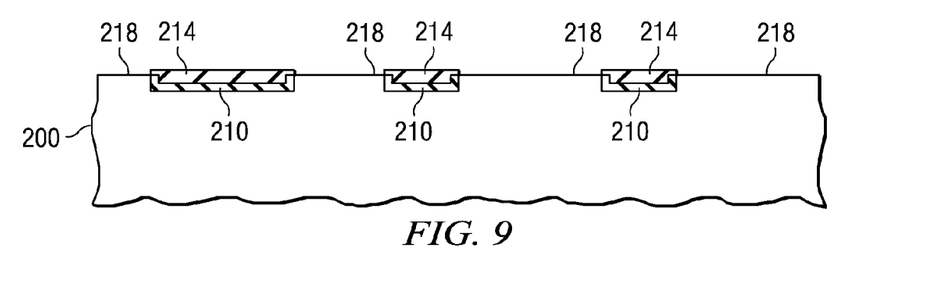

The second 204 and first 202 layers of dielectric material are then removed at 114 (e.g., via etching) (FIG. 8). It will be appreciated that the second 204 and first 202 dielectric materials may be removed in separate acts. It will also be appreciated that the layers depicted herein area not drawn to scale. For example, the first 202 and second 204 dielectric layers are much thinner (relative to other layers) than as depicted. Accordingly, the remaining fourth dielectric material 214 between the now exposed portions 218 of the substrate 200 may only stick up above the substrate a small amount (sometimes referred to as a step-height). A more realistic depiction of this step-height is illustrated in FIG. 9, where the non-uniformity between the fourth dielectric material 214 and the exposed portions 218 of the substrate 200 is barely noticeable. In one example, a hydrofluoric acid (HF) dip may be implemented prior to the removal of layers 204 and 202 to reduce the fourth dielectric material 214 to further reduce the step-height.

Figure 10:
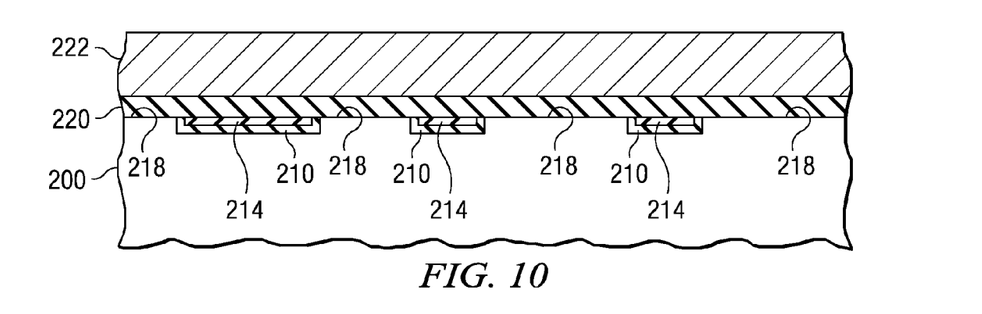

A relatively thin layer of gate dielectric material 220 is then formed over the exposed portions 218 of the substrate 200 and fourth dielectric material 214, and a layer of gate electrode material 222 is formed over the gate dielectric material 220 at 116 (FIG. 10). It will be appreciated that the aforementioned step-height is not illustrated in the remaining figures for purposes of simplicity. The gate dielectric material 220 may comprise an oxide based or high-K material, for example, and may be formed to a thickness of between about 1 nm and about 20 nm, for example. The gate electrode material 222 may comprise a polysilicon based material and/or other conductive material, for example, and may be formed to a thickness of between about 20 nm and about 100 nm, for example.

Figure 11:
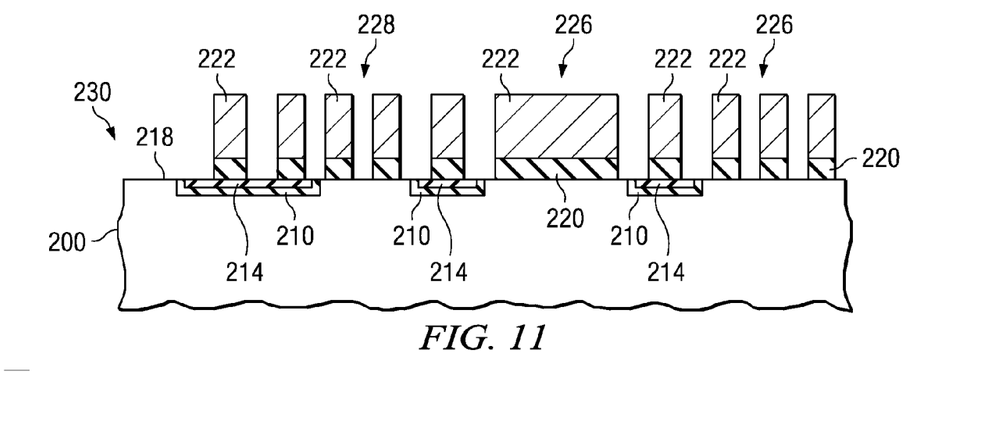

The gate electrode layer 222 and gate dielectric layer 220 are then selectively patterned at 118 to establish whole 226 and partial 228 dummy active areas in areas of the substrate 200 where semiconductor devices are not to be formed (FIG. 11). More particularly, the gate electrode layer 222 and gate dielectric layer 220 are patterned so that areas of the substrate 200 where semiconductor devices are not to be formed are filled in with whole dummy active areas 226, while areas of the substrate 200 where semiconductor devices are not to be formed but that can not accommodate whole dummy active areas are filled in with partial dummy active areas 228. It will be appreciated that this patterning is performed concurrently with patterning in areas of the semiconductor substrate where semiconductor devices are to be formed, i.e., in forming semiconductor devices (not shown) in non-dummy active areas 230.

Figure 12:
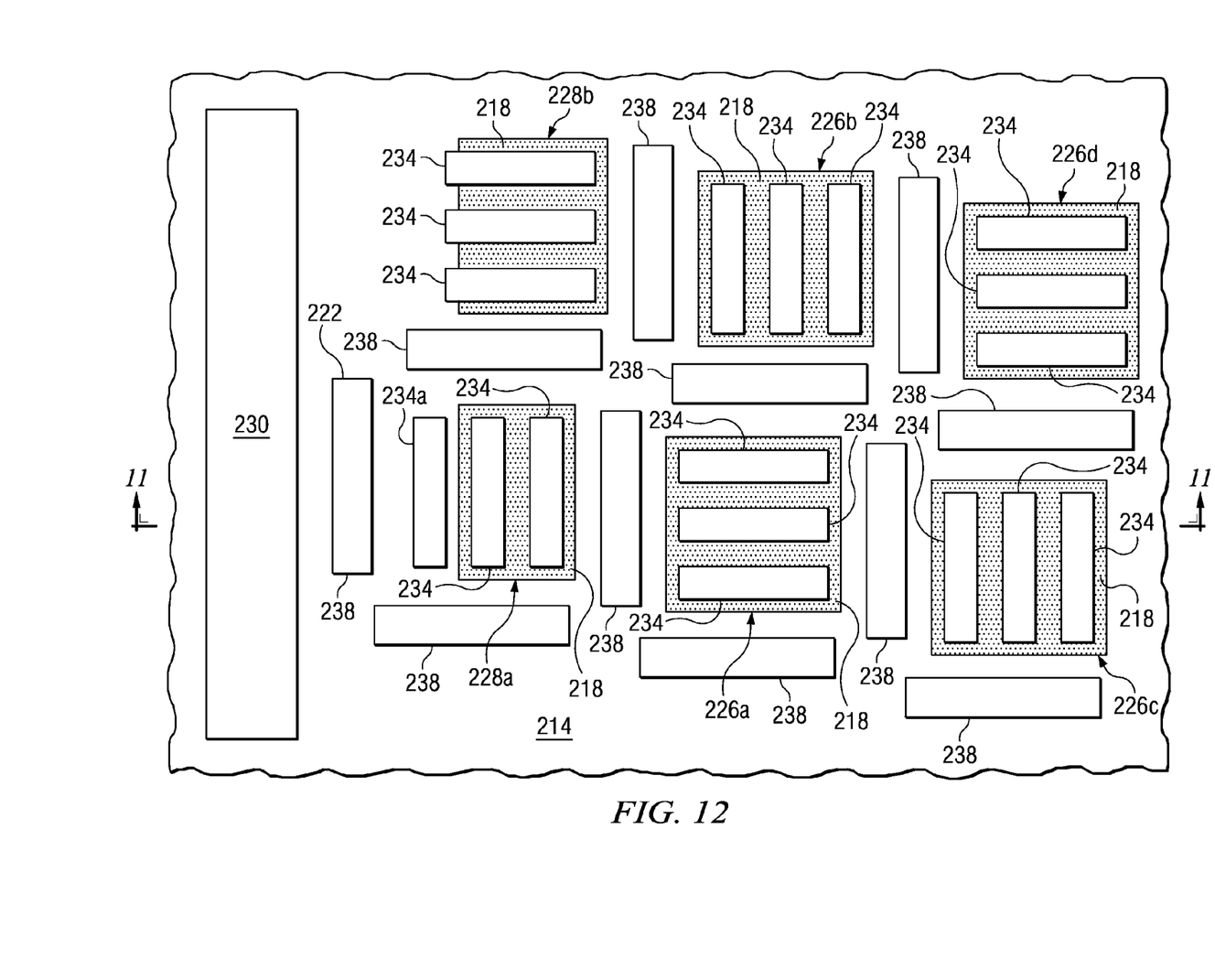

Turning to FIG. 12 (where FIG. 11 is a cross-sectional view taken along line 11-11 of FIG. 12), a top view of a semiconductor substrate illustrates the formation of whole 226 and partial 228 dummy active areas as described herein. Respective whole dummy active areas 226a, 226b, 226c, 226d comprise exposed portions 218 of the substrate 200 and three strips 234 of patterned gate electrode material 222 (overlying patterned gate dielectric material 220—not shown). Respective partial dummy active areas 228a, 228b similarly comprise exposed portions 218 of the substrate 200 and strips 234 of patterned gate electrode material 222 (overlying patterned gate dielectric material 220—not shown). It will be appreciated that since the strips 234 of patterned gate electrode material (and underlying patterned gate dielectric material 220—not shown) are not formed in areas of the substrate where semiconductor devices are to be formed, these strips 234 may be referred to as dummy gate areas.

The partial dummy active areas 228, and in particular the exposed portions 218 of the substrate 200 thereof, may, however, have smaller dimensions than the whole active areas 226. For example, the amount of exposed substrate 200 is reduced as the partial dummy active areas 228 approach non-dummy active areas 230 where semiconductor devices are actually to be formed. As depicted in the illustrated example, the strips 234 may then extend off of or past the exposed portions 218 of the substrate 200 in the partial dummy active areas 228. Each of the three strips 234 in partial dummy active area 228b, for example, extends past the exposed substrate by an equal amount. In contrast, one of the strips 234a in dummy active area 228a is formed entirely off of the exposed substrate 200, and is instead formed over the fourth dielectric material 214. Nevertheless, it will be appreciated that the dummy gate areas or strips 234 can (like the partial dummy active areas 228) be formed to have reduced dimensions (e.g., as they approach non-dummy active areas 230 where semiconductor devices are to be formed). In this manner, there can be partial as well as whole strips 234.

In addition to the dummy gate strips 234 over dummy active areas, the layer of gate electrode material 222 and the underlying layer of gate dielectric material 220 are patterned at 118 (FIG. 1) to form dividers 238 over the STI isolation areas 214 between the dummy active areas (e.g., concurrently with the formation of the dummy gate areas and semiconductor devices in non-dummy areas). The dividers 238 substantially improve the uniformity of the dummy gate areas and evenly separate the dummy active areas from one another. The dividers 238 can, however, similarly be adjusted in size (e.g., shortened) as they near non-dummy active areas 230. In this manner, there can be partial as well as whole dividers 238.

Figure 13:
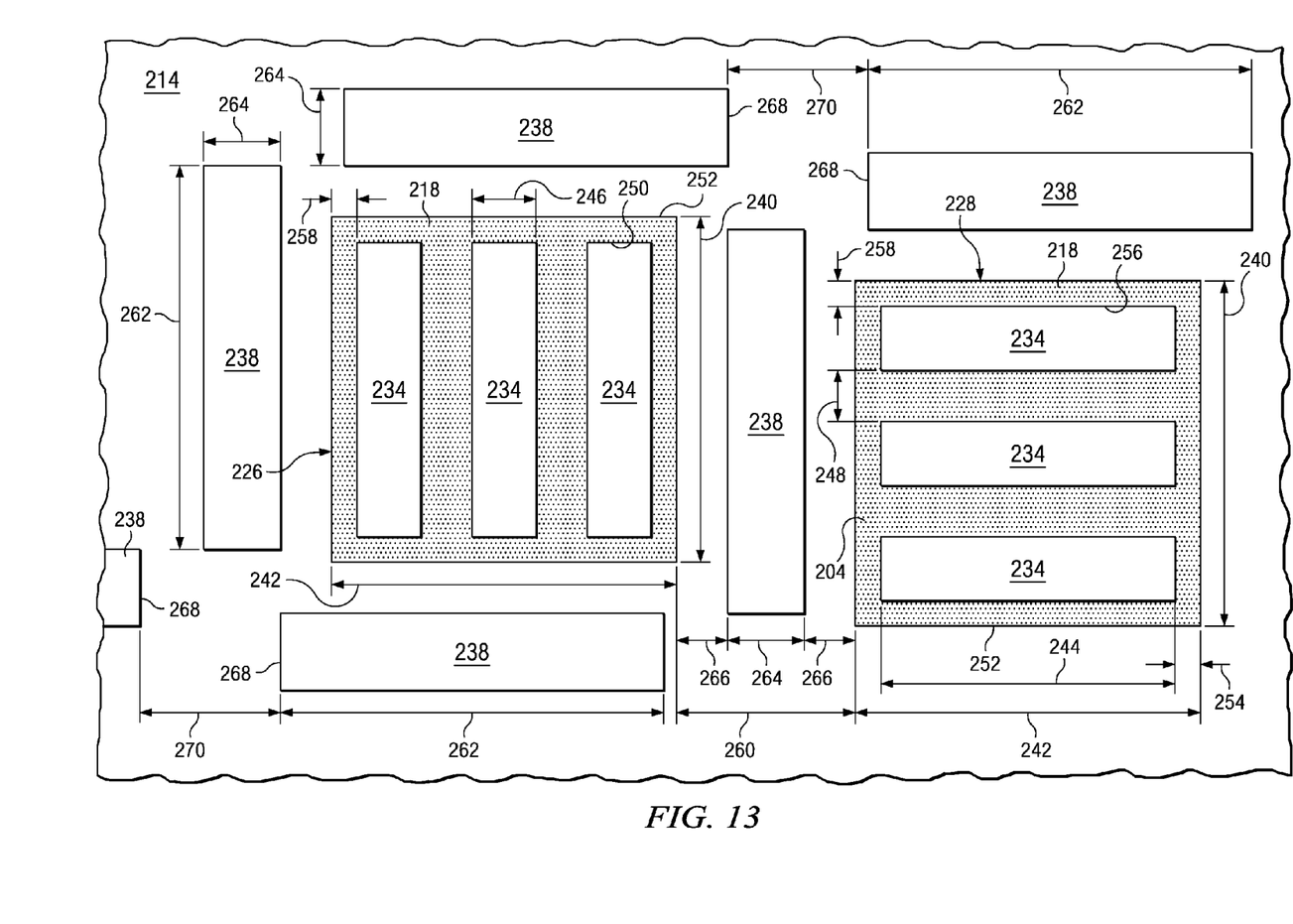

Turning to FIG. 13, a top view of a semiconductor substrate illustrates relative dimensions of the features described herein. For example, the exposed portions 218 of the substrate 200 in the whole dummy active areas have a width 240 of between about 0.8 units and about 1.2 units and a height 242 of between about 0.8 units and about 1.2 units. The strips 234 have a width 244 of between about 0.7 units and about 0.9 units and a height 246 of between about 0.16 units and about 0.2 units. The strips 234 are separated from one another by a distance 248 of between about 0.14 units and about 0.18 units. Ends 250 of the strips 234 are separated from edges 252 of the dummy active areas by a distance 254 of between about 0.09 units and about 0.11 units. Similarly, sides 256 of the strips 234 are separated from edges 252 of the dummy active areas by a distance 258 of between about 0.06 units and about 0.08 units. The dummy active areas are themselves separated from one another by a distance 260 of between about 0.5 units and about 0.7 units. The dividers 238 situated between the dummy active areas have a width 262 of between about 1.05 units and about 1.25 units and a height 264 of between about 0.22 units and about 0.26 units. The dividers 238 are separated from dummy active areas by a distance 266 of between about 0.20 units and about 0.22 units. Similarly, respective ends 268 of the dividers are separated from one another by a distance 270 of between about 0.495 units and about 0.515 units.

Figure 14:
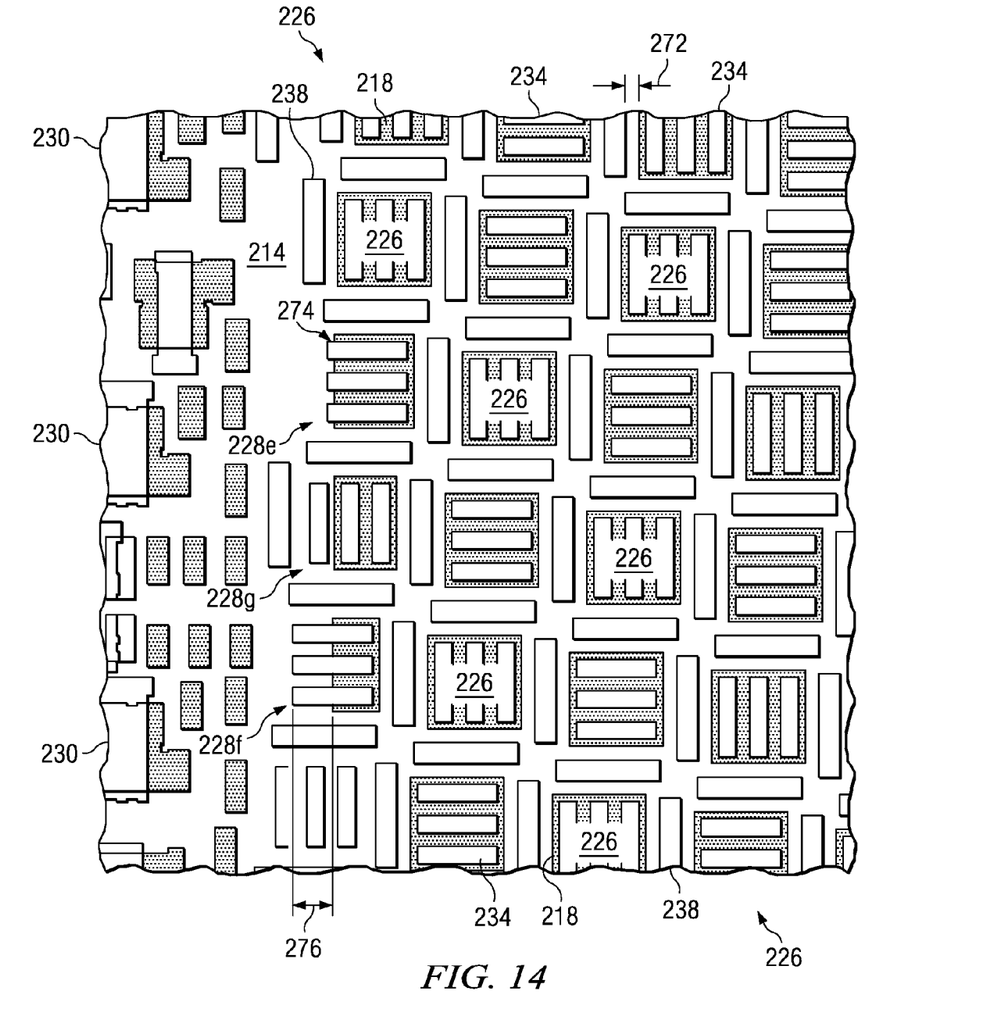
Figure 15:
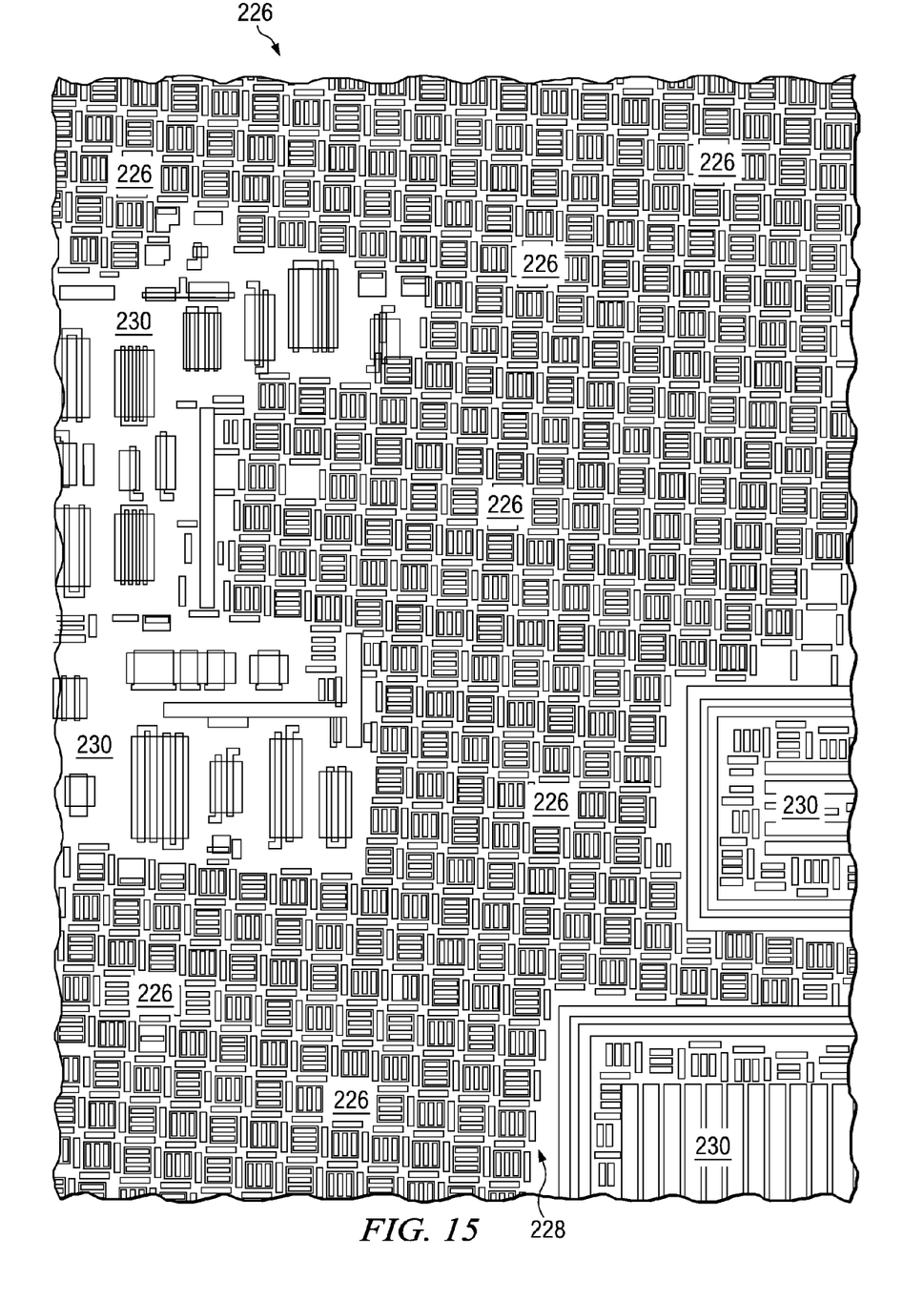

FIGS. 14 and 15 illustrate further examples of a semiconductor substrate where dummy active areas are implemented to fill in areas of the substrate that are not to have semiconductor devices formed thereon. It can be seen that the strips 234 of the dummy active areas are oriented differently among neighboring dummy active areas. More particularly, in the illustrated example, respective strips 234 are oriented substantially perpendicularly among neighboring dummy active areas. Moreover, this is true for whole 226 and partial 228 dummy active areas, where the strips 234 may extend over the exposed portions 218 of the substrate 200 in the partial dummy active areas 228. FIG. 14 illustrates, for example, the strips 234 of one partial dummy active area 228e extending past the exposed portion 218 of the substrate 200 by a distance 274 of between about 0.06 units and about 0.08 units near non-dummy active area 230. Similarly, the strips 234 of another partial dummy active area 228f are illustrated as extending past the exposed portion 218 of the substrate by a distance 276 of between about 0.4 units and about 0.6 units closer to the non-dummy active area 230. In the illustrated example, since the partial dummy active areas 228e and 228f are two neighbors away from one another, their respective strips 234 are substantially parallel to one another. Since, however, partial dummy active area 228g is situated between partial dummy active areas 228e and 228f, the respective strips 234 of partial dummy active area 228g are substantially perpendicular to the respective strips 234 of partial dummy active areas 228e and 228f. In addition to the strips or dummy gate areas 234 being oriented differently among neighboring dummy active areas, it can be seen that the dummy active areas (and thus the overlying strips 234 as well) are also staggered or offset from neighboring dummy active areas. For example, neighboring dummy active areas are shifted or offset from one another by a distance 272 of between about 0.14 units and about 0.22 units.

After the dummy active areas are formed (concurrently with semiconductor devices) further back end processing (not shown) can be performed where, for example, one or more overlying conductive and/or non-conductive layers can be formed and processed (e.g., patterned). It will be appreciated that establishing staggered dummy active areas and different orientation of strips 234 in adjacent dummy active areas as described herein mitigates parasitic issues. Parasitic issues can arise, for example, where one or more conductive lines are formed across or over the substrate. In the absence of staggered dummy active regions, some lines (or portions of some lines) may be routed over STI isolation areas of the substrate, while other lines (or portions thereof) may be routed over active areas. The capacitance developed between the conductive lines and the STI isolation areas of the substrate differs from the capacitance developed between the conductive lines and the active areas of the substrate. Parasitic capacitances can thus vary within respective lines and/or from line to line depending upon the routing of the lines. This can be problematic in many situations. For example, in some situations, two parallel lines, for example, may be designed to carry substantially similar signals, where such signals can, however, be affected (e.g., delayed) by parasitic capacitances. As such, where some of one line overlies unused areas of the substrate, but most, if not all, of the other line overlies active areas, there may be substantial disparity between the signals transmitted on the two different lines. With staggered dummy active areas in place, however, such lines experience substantially the same parasitic capacitance effects between the lines and underlying active regions. This is true regardless of whether the lines are routed over dummy and/or non-dummy active areas (since the dummy active areas mimic non-dummy active areas). Accordingly, the layout or routing of lines on the substrate is not constrained by issues related to parasitic capacitances. Implementing dummy active areas as described herein thus promotes a tighter signal distribution, where a spread or difference between signals going down one line versus signals going down a different line is mitigated.

Implementing dummy active areas as described herein also mitigates issues relating to chemical mechanical processing (CMP), such as is performed, for example, at 112 in method 100 (FIG. 7). In the absence of the dummy active areas, or if the dummy active areas are substantially larger than the true circuit geometries, surfaces may be polished less uniformly because unused areas of the substrate may be exposed or have different layers formed thereon than the layers formed over the non-dummy active areas (e.g., layers 202, 204, 214 (FIG. 6)). As such, the mechanical contact and/or interaction between the polishing pad and the substrate and the layers formed thereon can vary across the substrate. This can lead to over polished and damaged active areas, or active areas that are otherwise inconsistent or have operating characteristics that are spread across too broad of a range. Such areas of the substrate may then have to be scrapped, thus diminishing yield. With the whole dummy active and partial dummy active areas in place, however, the CMP is much more uniform since the dummy active areas are formed in the same manner, at the same time, to substantially the same height and size and with the same materials as the non-dummy active areas. As such, resulting active areas are much more uniform, and semiconductor devices formed thereon exhibit less leakage current. Fewer areas of the substrate thus have to be scrapped, and diminished yield is thereby mitigated.

Diminished yield is also mitigated by more uniform stress experienced in the substrate due to the dummy active areas. For example, in the absence of the whole dummy active and partial dummy active areas, large areas of dielectric material 214 may be formed over unused areas of the substrate. This material induces an actual physical stress in the substrate 200 that is different from the stress experienced in active areas, where such stress impacts the performance of semiconductor devices formed on the substrate 200. For example, too much stress can induce undesirable leakage and/or high off currents in semiconductor devices. As such, semiconductor devices formed in active areas that are close to unused areas of the substrate (e.g., that are filled in with STI) may perform undesirably and/or otherwise differently than devices formed away from such stressed areas. Such variations in performance may again require some of the substrate (and devices formed thereon) to be scrapped. Implementing the whole dummy active and partial dummy active areas as described herein mitigates this yield loss by making the stress across the substrate more uniform (e.g., by filling in the unused areas of the substrate with whole dummy active and partial dummy active areas, rather than STI).

It will be appreciated that gate critical dimension (CD) control is a very important factor in determining transistor performance and variability. Gate critical dimension control, for example, depends upon the area of exposed polysilicon during gate etch. The dummy gate design disclosed herein provides for improved consistency in the area of exposed polysilicon between different semiconductor circuit designs. This improves the gate CD control from on design to another.

It will be appreciated that an algorithm can be implemented to determine how and/or where to form the dummy active and dummy gate areas. For example, the amount of unused area on a semiconductor substrate can be determined once a circuit design is developed and "laid out" on the semiconductor substrate. The algorithm can then determine how much of the unused area of the substrate can be filled in with whole dummy active areas (e.g., given the dimension of the whole dummy active areas and the dividers, and the designated separations there-between). Then, the algorithm can go back and see how much of the remaining unused area of the substrate can accommodate partial dummy active and dummy gate areas, and what respective dimensions the partial dummy active and dummy gate areas should have to efficiently fill in these remaining unused areas of the substrate (e.g., based upon the distance between the non-dummy active areas and the closest whole dummy active area(s) and/or associated divider(s)).

It will also be appreciated that these features are first laid out and then formed into a mask or reticle, which is then used to transfer the pattern to the semiconductor substrate (e.g., via lithography). For example, a mask would be implemented to perform the patterning at 106 in method 100 and illustrated in FIG. 4. Similarly, a mask would be implemented to perform the patterning at 118 in method 100 and illustrated in FIG. 11. Such masks would be formed according to predetermined calculations of where non-dummy active areas 230, whole dummy active areas 226, partial dummy active areas 228, strips 234, dividers 238 and semiconductor devices are to be formed on the substrate 200 relative to one another. Generally speaking lithography refers to processes for transferring one or more patterns between various media. In lithography, a light sensitive resist coating is formed over one or more layers to which a pattern is to be transferred. The resist coating is then patterned by exposing it to one or more types of radiation or light which (selectively) passes through an intervening lithography mask containing the pattern. The light causes exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., etched).

It will be appreciated that optical proximity correction (OPC) can be applied separately to the dummy active areas and before being applied to non-dummy active areas to conserve resources. Optical proximity correction generally refers to one or more calculations that are done to account for the fact that features formed on semiconductor substrates are smaller than wavelengths of radiation used to form such features (e.g., via lithography). OPC thus provides a mechanism to provide a design for a mask that doesn't necessarily look like the features, but nevertheless forms the features on underlying layers after the wavelengths are distorted by the mask. OPC calculations can be intensive, time consuming and require significant computational resources. However, since the dummy active areas described herein are generally standardized, once a pattern in a mask is designed for one of them, then that patterning can merely be repeated for the remainder of the dummy active areas. This drastically reduces required calculations. For, example, it can be appreciated that a huge number of calculations would have to be performed if a separate OPC had to be performed for each of the features illustrated in FIG. 15 (including each of the dummy active areas). Thus, since the dummy active areas are amenable to pre OPC calculations, OPC calculations merely have to be performed on features to be formed in non-dummy active areas. This drastically reduces costs associated with producing masks and/or reticles.

Determining how to layout dummy active areas also allows approximately the same amount of area to be patterned/etched on different substrates. This is true regardless of the number and/or type of semiconductor devices and/or circuitry to be formed upon the different semiconductor substrates. The percent of the substrates (or layers formed thereover) that has to be patterned remains approximately the same, such as around 20 percent, for example. Stated another way, since resists are implemented in patterning layers, the amount that is exposed through differently patterned resists is about the same amount, regardless of the products being built. Keeping the amount of patterning/etching approximately the same from product to product is advantageous at least from an etching standpoint. For example, more uniform critical dimensions can be achieved from product to product. Having about the same amount of resist patterned (e.g., about 20 percent) regardless of the layout also maintains substantial uniformity in the amount of loading during plasma etch. This allows resulting semiconductor devices to be more uniform from product to product, further mitigating yield loss.

It will be appreciated that the relative size of the features disclosed herein allows them to be scaled as technology evolves and non-dummy active areas (and semiconductor devices formed thereon) are reduced in size. This preserves the forgoing advantages associated with, for example, parasitic capacitances, chemical mechanical polishing, induced stresses, etch loading, device uniformity, etc. For example, as feature sizes are scaled down, approximately the same percent (e.g., 20 percent) of the substrate (and/or layers formed thereover) will have to be patterned regardless of the devices formed and the corresponding patterns used.

It will be appreciated that substrate or semiconductor substrate as used herein may comprise any type of semiconductor body (e.g., silicon, SiGe, SOI), such as a semiconductor wafer or one or more die on a wafer, as well as any other type of semiconductor and/or epitaxial layers associated therewith. Also, while reference is made throughout this document to exemplary structures in discussing aspects of methodologies described herein (e.g., those structures presented in FIGS. 2-15 while discussing the methodology set forth in FIG. 1), those methodologies are not to be limited by the corresponding structures presented. Rather, the methodologies (and structures) are to be considered independent of one another and able to stand alone and be practiced without regard to any of the particular aspects depicted in the figures. Additionally, layers described herein can be formed in any suitable manner, such as with spin on, sputtering, growth and/or deposition techniques, etc.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method of manufacturing an integrated circuit including a plurality of operable semiconductor devices formed on a semiconductor substrate, comprising:

forming a layer of isolation material over the substrate;

patterning and etching the layer of isolation material to provide areas of exposed substrate separated by isolation material; the provided areas establishing device active areas in locations on the substrate where operable semiconductor devices will be formed, and dummy active areas covering the remainder of the substrate which will be unused for operable semiconductor devices; the dummy active areas including equally sized whole dummy active areas substantially uniformly distributed over a majority of the remainder of the substrate, and lesser sized partial dummy active areas formed over parts of the remainder of the substrate too small to accommodate the size of the whole dummy areas;

forming a layer of gate dielectric material over the patterned layer of isolation material, including over the provided areas of exposed substrate;

forming a layer of gate electrode material over the layer of gate dielectric material; and patterning and etching the layers of gate electrode material and gate dielectric material to concurrently form patterned gate structures of substantially same height and size in the device active areas and in the dummy active areas throughout the substrate;

wherein patterning and etching the layers of gate electrode material and gate dielectric material further comprises patterning and etching the layers of gate electrode material and gate dielectric material to form dividers over the isolation material between the dummy active areas concurrently with the formation of the gate structures, at locations substantially evenly spaced between neighboring dummy active areas.

2. The method of claim 1, wherein patterning and etching the layers of gate electrode material and gate dielectric material comprises patterning and etching the layers of gate electrode material and gate dielectric material to form pluralities of substantially parallel strips located over respective dummy active areas.

3. The method of claim 2, wherein the pluralities of strips of neighboring dummy active areas are oriented differently.

4. The method of claim 3, wherein the pluralities of strips of neighboring dummy active areas are oriented perpendicularly to one another.

5. The method of claim 4, wherein the neighboring dummy active areas are in staggered locations relative to one another.

6. The method of claim 2, wherein the dividers are formed as strips of substantially the same height as the strips of the gate structures, and oriented either parallel or perpendicular to the strips of the gate structures of neighboring dummy active regions.

7. The method of claim 2, wherein whole dummy active areas are sized in terms of relative dimensional units to have a width of between about 0.8 units and about 1.2 units, and a height of between about 0.8 units and about 1.2 units.

8. The method of claim 7, wherein respective parallel strips of the active dummy areas are formed in terms of the relative dimensional units to have a width of between about 0.7 units and about 0.9 units, and a height of between about 0.16 units and about 0.2 units.

9. The method of claim 8, wherein the parallel strips within a respective dummy active area are formed to be separated from one another by a distance expressed in terms of the relative dimensional units of between about 0.14 units and about 0.18 units.

10. The method of claim 9, wherein neighboring dummy active areas are separated from one another by a distance expressed in terms of the relative dimensional units of between about 0.5 units and about 0.7 units.

11. The method of claim 10, wherein the neighboring dummy active areas are staggered by a distance expressed in terms of the relative dimensional units of between about 0.14 units and about 0.22 units.

12. The method of claim 11, wherein ends of the strips are separated from edges of the respective dummy active areas by a distance expressed in terms of the relative dimensional units of between about 0.09 units and about 0.11 units; and sides of the strips are separated from edges of the dummy active areas by a distance expressed in terms of the relative dimensional units of between about 0.06 units and about 0.08 units.

13. The method of claim 12, wherein patterning and etching the layers of gate electrode material and gate dielectric material further comprises patterning and etching the layers of gate electrode material and gate dielectric material to form dividers over the isolation material between the dummy active areas concurrently with the formation of the gate structures, at locations substantially evenly spaced between neighboring dummy active areas; the dividers are formed as strips of substantially the same height as the strips of the gate structures, and oriented either parallel or perpendicular to the strips of the gate structures of neighboring dummy active regions; the dividers have, expressed in terms of the relative dimensional units, widths of between about 1.05 units and about 1.25 units, and heights of between about 0.22 units and about 0.26 units; and respective ends of the dividers are separated from one another by a distance expressed in terms of the relative dimensional units of between about 0.495 units and about 0.515 units.

14. A method of manufacturing an integrated circuit including a plurality of operable semiconductor devices formed on areas of a semiconductor substrate, including filling in areas of the semiconductor substrate which will be unused for operable semiconductor devices, comprising:

forming a first layer of dielectric material over the substrate;

forming a second layer of dielectric material over the first layer of dielectric material;

patterning the first and second dielectric layers and some of the substrate;

forming a third dielectric material over the second dielectric layer and the substrate;

planarizing the third layer of dielectric material back to the second layer of dielectric material;

removing the second and first layers of dielectric material;

forming a layer of gate dielectric material over the third layer of dielectric material and exposed portions of the substrate;

forming a layer of gate electrode material over the layer of gate dielectric material; and patterning the gate electrode material and the gate dielectric material:

to establish whole dummy active areas in areas of the semiconductor substrate which will be unused for operable semiconductor devices and which are large enough to accommodate whole dummy active areas, to establish partial dummy active areas in areas of the semiconductor substrate which will be unused for operable semiconductor devices and which are too small to accommodate whole dummy active areas, and to form respective dividers that substantially evenly separate dummy active areas from one another.

15. The method of claim 14, further comprising patterning the gate electrode material and the gate dielectric material to form a plurality of substantially parallel strips being patterned over respective dummy active areas.

16. The method of claim 14, wherein of the exposed areas of the substrate in whole dummy active areas are sized in terms of relative dimensional units to have a width of between about 0.8 units and about 1.2 units and a height of between about 0.8 units and about 1.2 units, and in terms of the relative dimensional units at least one of the following dimensioning is established:

respective strips having a width of between about 0.7 units and about 0.9 units and a height of between about 0.16 units and about 0.2 units;

the dividers having a width of between about 1.05 units and about 1.25 units and a height of between about 0.22 units and about 0.26 units;

the strips being separated from one another by a distance of between about 0.14 units and about 0.18 units;

dividers separated from dummy active areas by a distance of between about 0.20 units and about 0.22 units;

dummy active areas separated from one another by a distance of between about 0.5 units and about 0.7 units;

ends of the strips separated from edges of the dummy active areas by a distance of between about 0.09 units and about 0.11 units;

sides of the strips separated from edges of the dummy active areas by a distance of between about 0.06 units and about 0.08 units; or respective ends of the dividers separated from one another by a distance of between about 0.495 units and about 0.515 units.

* * * * *